(12) United States Patent
Chikamichi

(10) Patent No.: US 8,331,105 B2
(45) Date of Patent: Dec. 11, 2012

(54) CIRCUIT BOARD AND SEMICONDUCTOR DEVICE

(75) Inventor: Shoichi Chikamichi, Tokyo (JP)

(73) Assignee: NEC Corporation, Tokyo (JP)

( * ) Notice: Subject to any disclaimer, the term of this patent is extended or adjusted under 35 U.S.C. 154(b) by 325 days.

(21) Appl. No.: 12/749,049

(22) Filed: Mar. 29, 2010

(65) Prior Publication Data
US 2010/0182760 A1    Jul. 22, 2010

Related U.S. Application Data

(63) Continuation of application No. 12/049,646, filed on Mar. 17, 2008, now Pat. No. 7,719,093.

(30) Foreign Application Priority Data

Mar. 30, 2007  (JP) .................................. 2007-090819

(51) Int. Cl.
*H05K 7/00* (2006.01)

(52) U.S. Cl. ......... 361/780; 257/665; 257/690; 257/758
(58) Field of Classification Search ................ 361/780; 257/665, 690, 758
See application file for complete search history.

(56) References Cited

U.S. PATENT DOCUMENTS 6,691,296 B1 * 2/2004 Nakayama et al. ........... 716/122
7,719,093 B2 * 5/2010 Chikamichi .................. 257/665

FOREIGN PATENT DOCUMENTS

JP    2001237505 A  *  8/2001

* cited by examiner

*Primary Examiner* — Xiaoliang Chen

(57) ABSTRACT

A printed circuit board includes a source interconnect and a ground interconnect, and the circuit board has a two-dimensional geometry having a corner. Protruding portions are provided in circumferences of the source interconnect and the ground interconnect in regions except the corner in plan view, and the source interconnect and the ground interconnect are connected to a common first decoupling capacitor in each of the protruding portions.

12 Claims, 7 Drawing Sheets

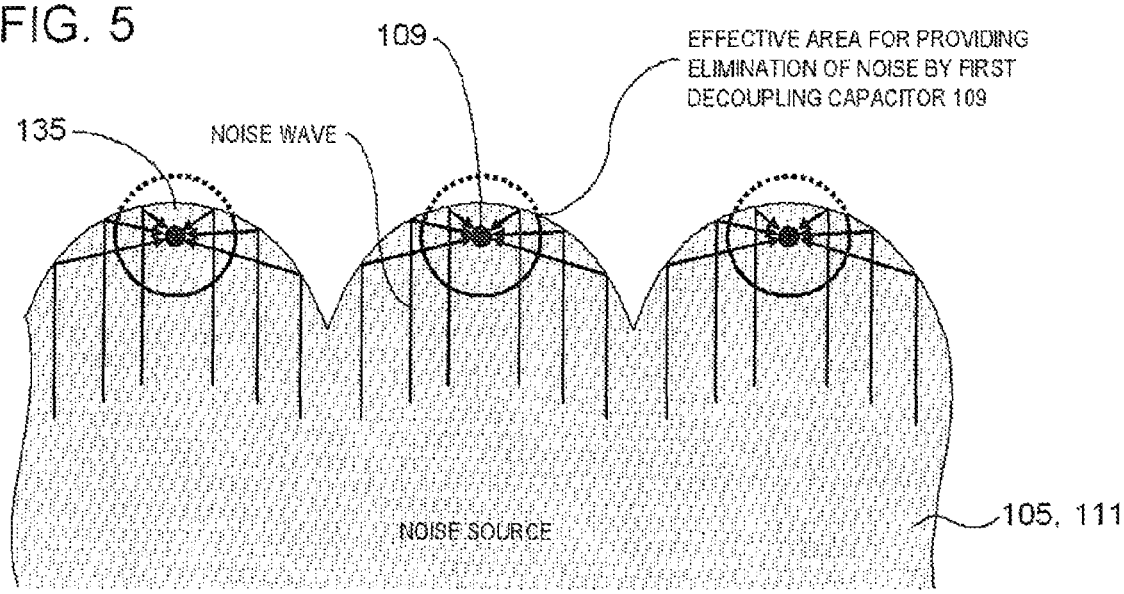

CIRCUIT BOARD AND SEMICONDUCTOR DEVICE

INCORPORATION BY REFERENCE

This is a continuation application of U.S. patent application Ser. No. 12/049,646 filed Mar. 17, 2008 now U.S. Pat. No. 7,719,093 and claims the benefit of its priority.

BACKGROUND

1. Technical Field

The present invention relates to a circuit board and a semiconductor device.

2. Related Art

Conventionally, efforts for reducing source noise and ground noise have been implemented by incorporating a filter circuit or a decoupling capacitor into a source line, as a countermeasure for an electro magnet interference (EMI) caused in a printed circuit board that has devices such as LSI mounted thereon.

Typical conventional technologies related to such noise reduction includes a technology described in Japanese Patent Laid-Open No. 2006-237,314 and a technology described in Japanese Patent Laid-Open No. 2001-237,505.

Japanese Patent Laid-Open No. 2006-237,314 describes that a reduction in a generation of a radiated noise can be achieved by disposing a capacitor in a corner of a rectangular circuit board. In addition, it is also described that a reduction in a displacement of a standing wave can be more effectively achieved by disposing capacitors in a plurality of corners.

Japanese Patent Laid-Open No. 2006-237,314 also describes that capacitors are disposed in positions in a side of a circuit board equally distributed by diving the length of the side with n integer number "n" with equal intervals therebetween, in which a displacement of a standing wave generated due to a resonance is increased, so that a generation of a radiated noise is inhibited to reduce a fluctuation of voltage between a source interconnect layer and a ground interconnect layer with an improved efficiency. In addition, it is also described that additional capacitors are additionally disposed arbitrary sides of the circuit board in addition to providing capacitors in one side, so that a displacement of a standing wave is more effectively reduced. According to Japanese Patent Laid-Open No. 2006-237,314, it is described that smaller number of capacitors disposed in smaller number of positions equally distributed in the side of the circuit board with equal intervals therebetween allows further inhibition of a displacement of a standing wave, and in particular, if a capacitor is disposed in a position where a side of the circuit board is divided by two, a maximum reduction in a displacement of a standing wave can be achieved.

Further, Japanese Patent Laid-Open No. 2006-237,314 also describes that capacitors are provided so as to annularly surround an edge of the circuit board and have no section in the cyclic edge of the circuit board without being covered by a capacitor.

Japanese Patent Laid-Open No. 2001-237,505 describes a printed circuit board having a pattern of grounds provided in a periphery of a source interconnect in plane that also includes a source layer. It is also described that the electrodes are formed to have a zigzag-shape or an interdigit-shape in a section where the source interconnect faces the ground pattern. According to Japanese Patent Laid-Open No. 2001-237,505, it is described that a ground pattern is provided in a periphery of a source interconnect, so that capacitors are formed therebetween to provide an inhibition of a source noise reflected from an end of the printed circuit board. It is also described that the electrodes are formed to have a zigzag-shape or an interdigit-shape to provide an increased capacitance of a capacitor for terminal end, thereby further enhancing an advantageous effect of reducing a source noise.

On the contrary, though the technical field is not related to the present invention, Japanese Patent Laid-Open No. 2004-40,650 discloses a parallel plate track device, which is manufactured by disposing a dielectric film between two opposing metallic members so as to meander through the metallic, members to serve as a transmission line.

The present inventors investigated the technology described in Japanese Patent Laid-Open No. 2006-237,314, and found that there is a need to provide a reduced high frequency noise.

Relatively-low frequency noise can be improved to a certain extent by disposing capacitors on four corners or any sides of the rectangular circuit board as described in Japanese Patent Laid-Open No. 2006-237,314. On the contrary, when the frequency of noise is increased to, for example, 1 GHz or higher, it is difficult to effectively eliminate a source noise and a ground noise by simply arranging the capacitors in the ends of the rectangular circuit board, and if a noise is to be eliminated by the capacitors arranged along the side of the rectangular circuit board, a number of capacitors are required, and thus such approach is not effective.

Thus, residual high-frequency source noise and ground noise, which are not completely eliminated to remain, repeatedly reflect on the source interconnect in the circuit board and on a circumference of the source interconnect and the ground interconnect, creating resonance points in specified locations in a surface including the source interconnect and the ground interconnect, which are the reasons for creating larger common-mode noises.

A possible approach to eliminating a high-frequency noise may be a process for predicting positions of the resonance points created in the source interconnect and the ground interconnect, and then coupling decoupling capacitors in such positions. However, since the positions of the resonance points depend upon various factors such as positions of the devices serving as noise sources, frequency components of noise, type, number and position of decoupling capacitor, geometries of the source layer and the ground layer or the like, the prediction thereof by utilizing the conventional configuration is difficult.

SUMMARY

A circuit board according to an exemplary aspect of the invention includes a source interconnect and a ground interconnect, the circuit board having a two-dimensional geometry having a corner, protruding portions being provided in circumferences of the source interconnect and the ground interconnect in regions except the corner in plan view, and the source interconnect and the ground interconnect being connected to a common decoupling capacitor in each of the protruding portions.

BRIEF DESCRIPTION OF THE DRAWINGS

The above and other objects, advantages and features of the present invention will be more apparent from the following description of exemplary embodiments taken in conjunction with the accompanying drawings, in which:

FIG. 5 is a plan view, illustrating a configuration of an interconnect of a circuit board in an exemplary embodiment;

DETAILED DESCRIPTION

Figure 1:
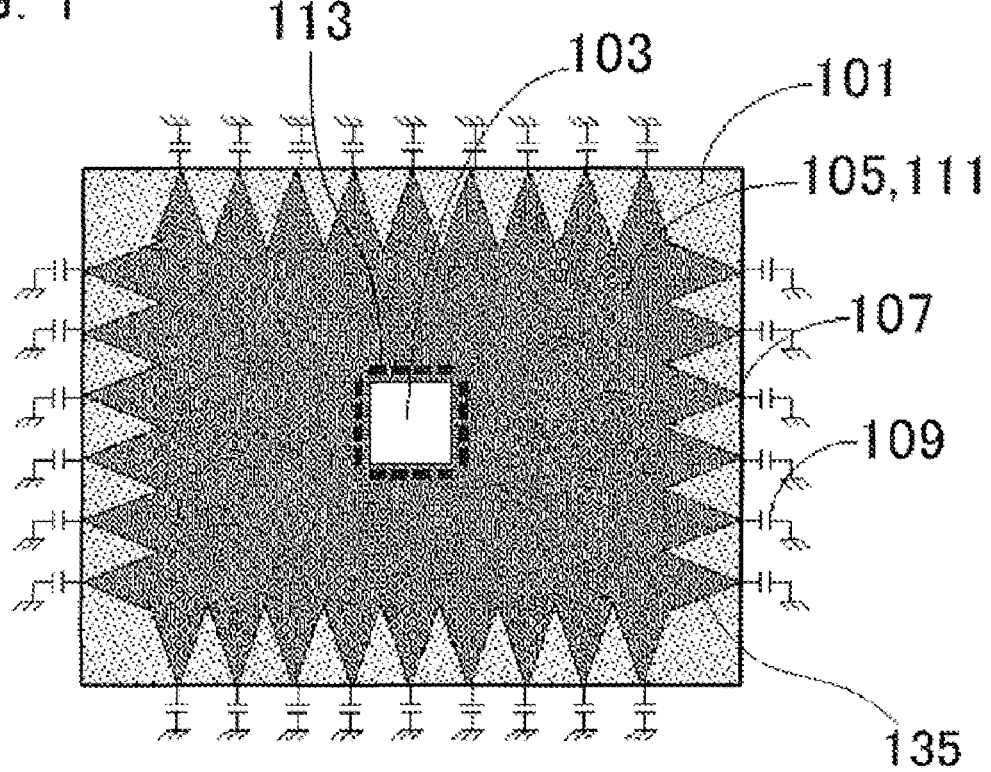
FIG. 1 is a plan view, illustrating a configuration of a semiconductor device in an exemplary embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

As described above for the related art, when a noise generated in the circuit board is of relatively lower frequency, the noise almost converges in the corner of the circuit board. For example, when the circuit board is rectangular, the noise converges in the four corners of the circuit board. On the contrary, since a probability of a high frequency noise to reflect in the circumference thereof except the corners is relatively high, a large number of resonance points are created by the reflected noise in the surface of the interconnect.

To solve the problem, exemplary embodiments provides protruding portions in the circumferences of the source interconnect and the ground interconnect in regions except the corners of the circuit board. By providing the protruding portions, noises can converge in the protruding portion to intentionally create resonance points in the protruding portions. Having such configuration, noises reflected in the circumference of the interconnect propagates to the inside of the circuit board rather than in the protruding portions, the resonance points created from the protruding portions to the internal region of the interconnect can be inhibited.

Further, since the source interconnect and the ground interconnect are connected to the decoupling capacitors in the protruding portion according to exemplary embodiments, noises converged to the protruding portions can be eliminated.

As described above, a synergistic effect obtained by providing the protruding portions in the circumferences of the source interconnect and the ground interconnect and by connecting the protruding portions to the decoupling capacitors in regions except the corner of the circuit board in exemplary embodiments allows effectively eliminating high frequency noise with an improved efficiency.

In addition to above, in the technology disclosed in Japanese Patent Laid-Open No. 2006-237,314 described above in the description of the related art, capacitors are arranged in the four corners or along a side of a rectangular circuit board. Among these, the positions provided by dividing the whole length of the rectangular circuit by "n" may not be resonance points. Thus, when a high-frequency noise is to be absorbed in the side by merely arranging the decoupling capacitors long the side as described in Japanese Patent Laid-Open No. 2006-237,314, greater number of decoupling capacitors are required to be arranged, which is not a realistic solution.

On the contrary, exemplary embodiments provides protruding portions in the circumferences of the source interconnect and the ground interconnect in regions except the corners of the circuit board, so that noises can be guided to the protruding portions. Thus, the positions for the convergence of noise can be specified even if the noise is at higher frequency of, for example, 1 GHz or higher, so that the noise can be eliminated with an improved efficiency by arranging the decoupling capacitors in such positions.

In addition to above, the protruding portion in exemplary embodiments may be at least a member, which can achieve a convergence of noises propagating through the interconnect in the protruding portions, for example, typically be a member having a decreasing diameter from the inside toward the circumference of the interconnect. Further, since the protruding portion is a member for guiding noise, the protruding portions are provided in regions except the corners of the circuit board.

In addition, in exemplary embodiments, the expression "noise converges in the protruding portion" means that the noise is guided into the protruding portion to create a resonance point. The resonance point may be created in the circumference of the interconnect in the protruding portion or in the inside of the interconnect in the region for forming the protruding portion.

Exemplary implementations according to the present invention will be described in reference to the annexed figures. In all figures, an identical numeral is assigned to an element commonly appeared in the figures, and the detailed description thereof will not be repeated.

First Exemplary Embodiment

Figure 2:
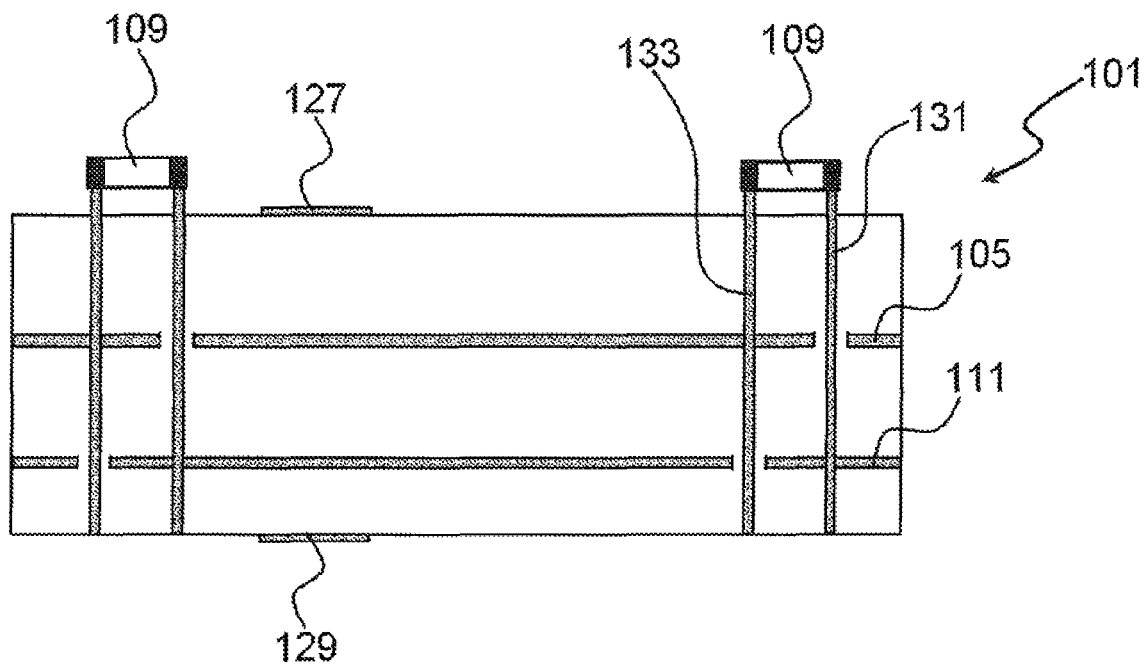
FIG. 2 is a cross-sectional view, illustrating a configuration of a circuit board in an exemplary embodiment.

FIG. 1 is a plan view, schematically illustrating a configuration of a semiconductor device in the present exemplary embodiment. FIG. 2 is a cross-sectional view, illustrating a configuration of a printed circuit board 101 of the semiconductor device shown in FIG. 1. As shown in FIG. 1 and FIG. 2, a semiconductor device in the present exemplary embodiment includes a printed circuit board 101, first decoupling capacitors 109 connected to protruding portions 135 of the circuit board, and a semiconductor element 103 mounted in a surface of the printed circuit board 101.

The printed circuit board 101 has a two-dimensional geometry having a corner, and is rectangular-shaped in the present exemplary embodiment. The printed circuit board 101 includes a source interconnect layer (not shown) including a source interconnect 105, a ground interconnect layer (not shown) including a ground interconnect 111 and a signal interconnect layer (not shown) including a signal interconnect (signal interconnect 127, signal interconnect 129). FIG. 1 illustrates an exemplary implementation, in which a pair of facing source interconnect 105 and ground interconnect 111 has the same two-dimensional geometry.

In plan view, in regions except the corners of the printed circuit board 101, a plurality of protruding portions 135 are provided in circumferences of the source interconnect 105 and the ground interconnect 111 to form a column-like pattern, and the source interconnect 105 and the ground interconnect 111 in each of the protruding portions 135 are coupled to a common decoupling capacitors (first decoupling capacitor 109).

In addition, each of the circumferences of the source interconnect 105 and the ground interconnect 111 is formed to have a zigzag-shape (for example, saw-toothed shape), and a plurality of protruding portions 135 are continually provided therein. A tip of the protruding portion 135 is edge like-shaped. The protruding portion 135 is provided over the entire circumferences of the source interconnect 105 and the ground interconnect 111.

First decoupling capacitors 109 are coupled to edges (tips 107) in the protruding portion. The first decoupling capacitors 109 are disposed in the outermost layer (upper portions in the exemplary implementation of FIG. 2), of the region for forming the respective protruding portions 135, and a plurality of protruding portions 135 are coupled to respective different first decoupling capacitors 109. In a protruding portion 135, the source interconnect 105 is coupled to the first decoupling capacitor 109 through a first through electrode 133, and the ground interconnect 111 is coupled to the first decoupling capacitor 109 through a second through electrode 131. The first decoupling capacitor 109 is, for example, a ceramic capacitor.

As shown in FIG. 1, a plurality of second decoupling capacitors 113 are also arranged along the circumference of the semiconductor element 103.

Next, a method for eliminating noise from the semiconductor device shown in FIG. 1 and FIG. 2 will be described.

This method is a method for eliminating noise, in which, in regions except the corners of the printed circuit board 101 having a two-dimensional geometry having corners, the source interconnect 105 and the ground interconnect 111 are formed to have a two-dimensional geometry having noise resonance points in the circumference or its vicinity in regions except the corners, and the noise generated in the source interconnect 105 and the ground interconnect 111 is guided to the first decoupling capacitors 109 from the resonance points of the respective interconnects.

In addition to above, the circumference or its vicinity of the interconnect indicates regions of the circumference of the interconnect or regions in vicinity of the circumference within the interconnect, and more specifically, the regions of the circumference of the protruding portion 135 and the regions of the inside of the protruding portion 135.

In the semiconductor device shown in FIG. 1 and FIG. 2, the resonance points of noise are present in the protruding portions 135 of the source interconnect 105 and the ground interconnect 111. In the regions except the corners of the printed circuit board 101, a noise is guided to the protruding portions 135 of the source interconnect 105 and the ground interconnect 111, the guided noise is resonated in specified positions in the protruding portions 135. The noise resonated in the protruding portions 135 is, in turn, is guided to the decoupling capacitors 109 connected to the protruding portions 135. As described above, the noise within the interconnects is guided to the interior of the protruding portions 135 provided in the end sections of the interconnects to be eliminated by the first decoupling capacitors 109.

More specifically, in the present exemplary embodiment, the circumferences of the source interconnects 105 and the ground interconnects 111 of the printed circuit board 101 are formed to be sawtooth-shaped, so that a plurality of protruding portions 135 are linearly arranged along a side of the printed circuit board 101. The source noise and the ground noise emitted from the semiconductor element 103 are guided to apexes 107 of the protruding portions 135 provided in the respective electrodes, where the apexes 107 serve as resonance points for the noises. The first decoupling capacitors 109 are, in turn, connected to the respective apexes 107 in order to eliminate noises in the resonance points. This allows preventing the source noise and the ground noise from being reflected again to the inside of the substrate in the regions except the corners (four corners) of the printed circuit board 101, providing an inhibited generation of the resonance points within the interconnects and a reduced intensity of the noise. Thus, a common-mode noise and EMI can be reduced.

Next, advantageous effects obtainable by employing the configuration of the present exemplary embodiment will be described.

First of all, in the semiconductor device shown in FIG. 1 and FIG. 2, the circumferences of the source interconnect 105 and the ground interconnect 111 are formed to sawtooth-shape to provide the protruding portions 135 in the regions except the corners of the printed circuit board 101. Thus, the source noise and the ground noise emitted by the semiconductor element 103 can be guided to the apexes 107 of the protruding portions 135.

In addition, in the semiconductor device shown in FIG. 1 and FIG. 2, the first decoupling capacitors 109 are connected to respective apexes 107. Thus, this can prevent the source noise and the ground noise the source noise and the ground noise guided to the respective apexes 107 from being reflected again within the protruding portions 135 and from being propagated through the substrate, eliminating the noises.

Since the source noise and the ground noise can be guided to protruding portions 135 to eliminate from the apexes 107 in this way, reflections of the source noise and the ground noise into the interior of the printed circuit board can be prevented. This allows providing an inhibited generation of the resonance points within the source interconnect 105 and the ground interconnect 111 and a reduced intensity of the noise. Thus, a common-mode noise and EMI can be reduced.

Figure 7:
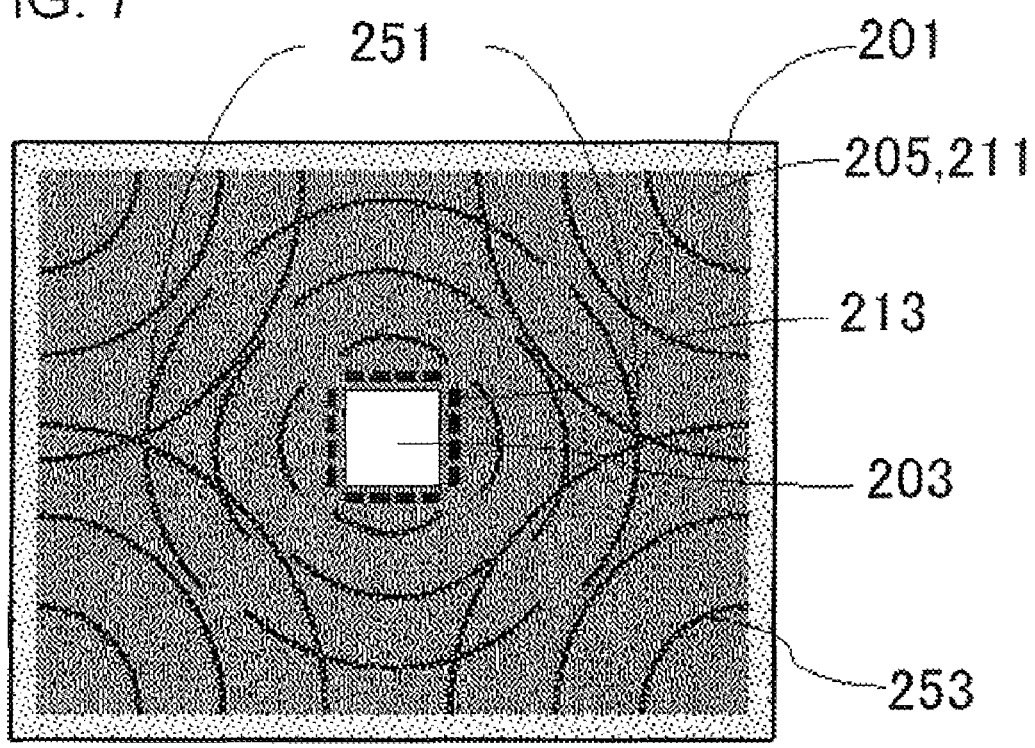
FIG. 7 is a plan view, illustrating a configuration of a semiconductor device in an exemplary embodiment.

Now, FIG. 7 is a plan view, schematically illustrating a configuration of a printed circuit board, which has no protruding portion. In FIG. 7, two-dimensional geometries of a source interconnect 205 and a ground interconnect 211 provided in a printed circuit board 201 are rectangular. Semiconductor elements 203 are installed on the printed circuit board 201. In FIG. 7, an exemplary implementation having second decoupling capacitors 213 arranged along the circumference of the semiconductor element 203 is shown, corresponding to FIG. 1.

It is difficult to completely eliminate the source noise and the ground noise in the case shown in FIG. 7, if the noise generated by the semiconductor element 203 is high-frequency noise, and residual source noise and ground noise, which are not completely eliminated to remain, repeatedly reflect on the circumference edges of the source interconnect 205 and the ground interconnect 211 in the printed circuit board 201 and a reflected noise 253, in turn, creates resonance points 251 in specified locations in the source interconnect 205 and the ground interconnect 211.

On the contrary, the protruding portions 135 are provided in the regions of the source interconnect 105 and the ground interconnect 111 except the four corners of the board in the present exemplary embodiment, so that resonance points of noises are intentionally formed in locations along the sides of the printed circuit board 101, which are more influential to the reflected noises, thereby absorbing the noise wave by the protruding portions 135. The configuration of the protruding portions 135 connected to the respective first decoupling capacitors 109 prevents the noise converged into the protruding portions 135 from being reflected and moving toward the inside of the interconnects beyond the protruding portion 135. This allows effectively eliminating the source noise and the ground noise with an improved efficiency, even if the noise is high-frequency noise. Such advantageous effect is more considerably exhibited if the protruding portions 135 are formed over the entire circumferences of the source interconnect 105 and the ground interconnect 111.

In addition, according to the present exemplary embodiment, the configuration of the source interconnect 105 and the ground interconnect 111 including the resonance points within the protruding portions 135 is provided. Thus, unlikely the configuration shown in FIG. 7, a prediction of the resonance points 251 is not required. The nature of the resonance points 251 depends upon various factors such as positions of the semiconductor elements 203 serving as noise sources, frequency components of the noise, type, number and position of decoupling capacitors, geometries of the source layer and the ground layer or the like, and therefore the prediction thereof is difficult. Although such prediction has been realized by utilizing a simulator, enormous number of modeling processes and huge amount of simulation time are necessary for obtaining an improved simulation accuracy. According to the present exemplary embodiment, the locations of the resonance points are specified and the resonance points are substantially formed within the respective protruding portions 135, so that such prediction of the resonance points 251 is not required.

In addition, since different locations of the resonance points are provided for different frequency components of the noise in example shown in FIG. 7, even if the locations of resonance points 251 can be predicted, it is necessary to distribute decoupling capacitors over the board for eliminating noises over wider frequency-ranges. On the contrary, the present exemplary embodiment merely requires arranging the first decoupling capacitors 109 in vicinity of the end section of the printed circuit board 101, such that the interior of the printed circuit board 101 can be effectively utilized.

As described above, according to the present exemplary embodiment, high-frequency source noise and ground noise can be eliminated with an improved efficiency.

In the following exemplary embodiments, features that are not included in first exemplary embodiment will be described.

Second Exemplary Embodiment

In the present exemplary embodiment, another exemplary implementation for different two-dimensional geometry of the protruding portion that are also employed in first exemplary embodiment will be illustrated. The protruding portion may be at least a member having a two-dimensional geometry, a diameter of which is decreased from the inside of the printed circuit board 101 toward the circumference thereof, and the two-dimensional geometry thereof is not particularly limited to the geometry shown in FIG. 1.

FIG. 3A to FIG. 3C and FIG. 4 are diagrams, illustrating geometries of circumference portions of the source interconnect 105 and the ground interconnect 111 of the printed circuit board in the present exemplary embodiment.

Figure 3A:
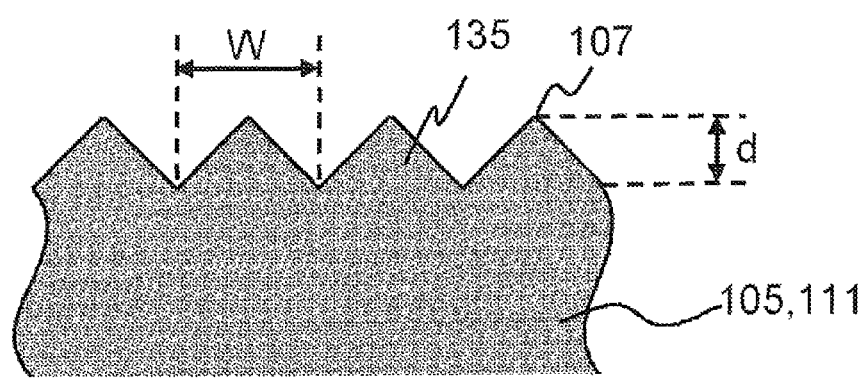
FIGS. 3A to 3C are plan views, illustrating configurations of interconnects of circuit boards in an exemplary embodiment.

FIG. 3A corresponds to a circuit board shown in the description of first exemplary embodiment (FIG. 1), and the circumferences of the source interconnect 105 and the ground interconnect 111 is formed to have a zigzag-shape.

Figure 3B:
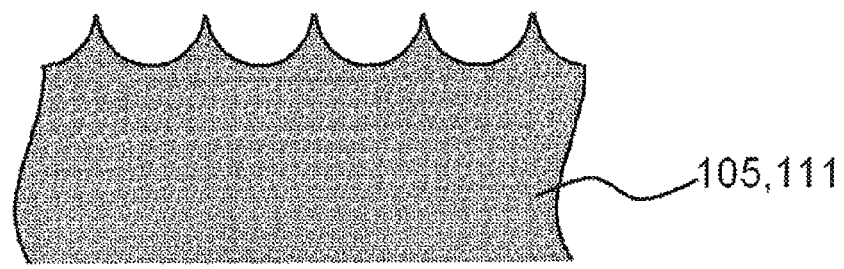

In FIG. 3B, the circumference of the electrode is formed to have a geometry provided by combining several curves.

Figure 3C:
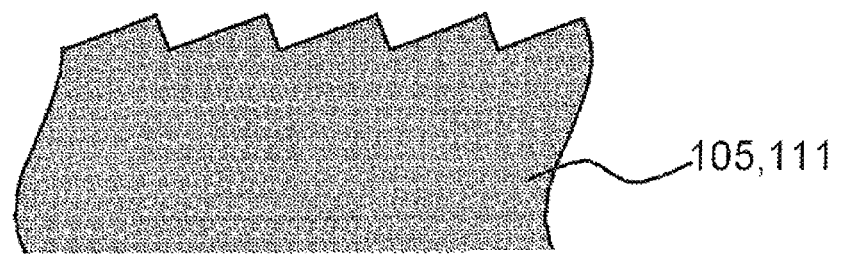

In FIG. 3C, the circumference of the electrode is also formed to have a zigzag-shape, and the geometry of the protruding portion is asymmetric to an axis extending from the apex 107 toward the inside of the interconnect.

In any of FIG. 3A to FIG. 3C, the tips of the protruding portions 135 are edge like-shaped, and the apexes 107 of the edges are connected to the respective first decoupling capacitors 109.

However, the first decoupling capacitors 109 may be at least disposed in locations, where noises guided to respective protruding portions 135 can be eliminated, and are not necessary to be connected to the apexes 107 of the protruding portions 135. The first decoupling capacitors 109 may be at least disposed above the region for forming the protruding portion 135, for example.

Figure 4:
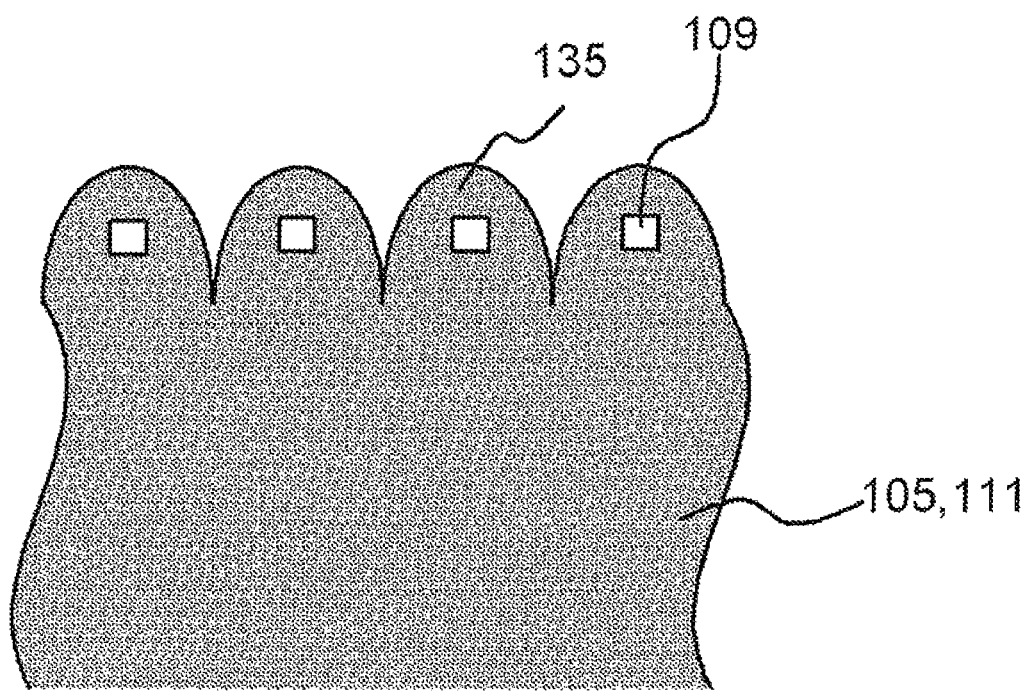
FIG. 4 is a plan view, illustrating a configuration of an interconnect of a circuit board in an exemplary embodiment.

FIG. 4 is a plan view, illustrating an exemplary implementation of an electrode, in which a circumference of a protruding portion is parabola-shaped in plan view. In FIG. 4, the circumference of the electrode has a geometry provided by combining several parabolas, in which a focal point of a parabola is connected to a first decoupling capacitor 109.

FIG. 5 is a diagram, useful in describing a method for eliminating a noise employing the electrode shown in FIG. 4. Since the circumference of the protruding portion 135 is parabola-shaped in FIG. 4 and FIG. 5, a noise wave propagated into the protruding portion 135 converges to a focal point of the protruding portion 135.

Since the protruding portion 135 is configured to have sufficiently larger width (W) as compared with an effective area for providing an elimination of a noise by the first decoupling capacitor 109 (diameter of circle shown in FIG. 5) in the geometry of the electrode shown in FIG. 5, considerably reduced quantity of the first decoupling capacitors 109 required for eliminating noise can be achieved. This allows eliminating a noise with higher efficiency by employing a reduced number of decoupling capacitors.

In addition to above, according to investigations of the present inventors, a result was obtained that an effective area for providing an elimination of a noise by a ceramic capacitor of 0.1 μF is generally a circle having a radius of about 5 mm, though the dimension thereof changes depending upon the frequency of the noise. Here, the effective area for providing an elimination of a noise means an area for providing an eliminated noise, which is equal to or lower than ⅓ of the eliminated noise in the case where no decoupling capacitor is arranged.

Taking the above-described results of the present inventors into consideration, if the number of the decoupling capacitors arranged along the sides of the rectangular circuit board is merely reduced as in the technology disclosed in Japanese Patent Laid-Open No. 2006-237,314 described above in the description of the related art, it is necessary to arrange the ceramic capacitors with intervals of about 10 mm, which corresponds to a diameter of the effective area for providing the elimination of the noise by the decoupling capacitor, in order to effectively eliminate the noise.

On the contrary, if the geometry of the electrode as shown in FIG. 4 and FIG. 5 is employed, an arrangement of the first decoupling capacitors 109 with considerably larger intervals, which are larger than the diameter of the effective area for providing the elimination of noises by the first decoupling capacitors 109, can be employed, by employing protruding portions 135 having wider widths (W), thereby providing a considerably reduced quantity of the first decoupling capacitors 109.

In addition, the two-dimensional geometries of the protruding portions 135 shown in FIG. 3A, FIG. 3B and FIG. 4 are symmetric to an axis extending from the tip of protruding portion 135 toward the inside of the interconnect, so that such protruding portions achieve more effective elimination of noises, as compared with the electrode having the geometry shown in FIG. 3C.

Here, the geometry of the protruding portion 135 can be designed to be optimized according to the frequency of the noise to be eliminated. In addition, another type of protruding portion 135 having a geometry that is designed to be suitable for a frequency of a noise may be provided in the circumference of the source interconnect 105 and the ground interconnect 111. For example, in the configuration shown in FIG. 3A, a width (W) and a depth (d) of a protruding portion 135 are reduced for higher frequency of noise.

On the other hand, in view of miniaturization of the whole circuit board, reduced regions for forming the protruding portions of the source interconnect 105 and the ground interconnect 111 are preferably employed. For example, the geometry of the protruding portion 135 may be preferably designed to have the depth (d), which is relatively smaller than the width (W). A typical example of such geometry may be a parabola shown in FIG. 4 and FIG. 5.

Third Exemplary Embodiment

While the source interconnect 105 in the source interconnect layer is configured to be composed of from a single region is illustrated in first exemplary embodiment, a quantity and a geometry of the source interconnect 105 in a single source interconnect layer is not limited thereto.

Figure 6A:
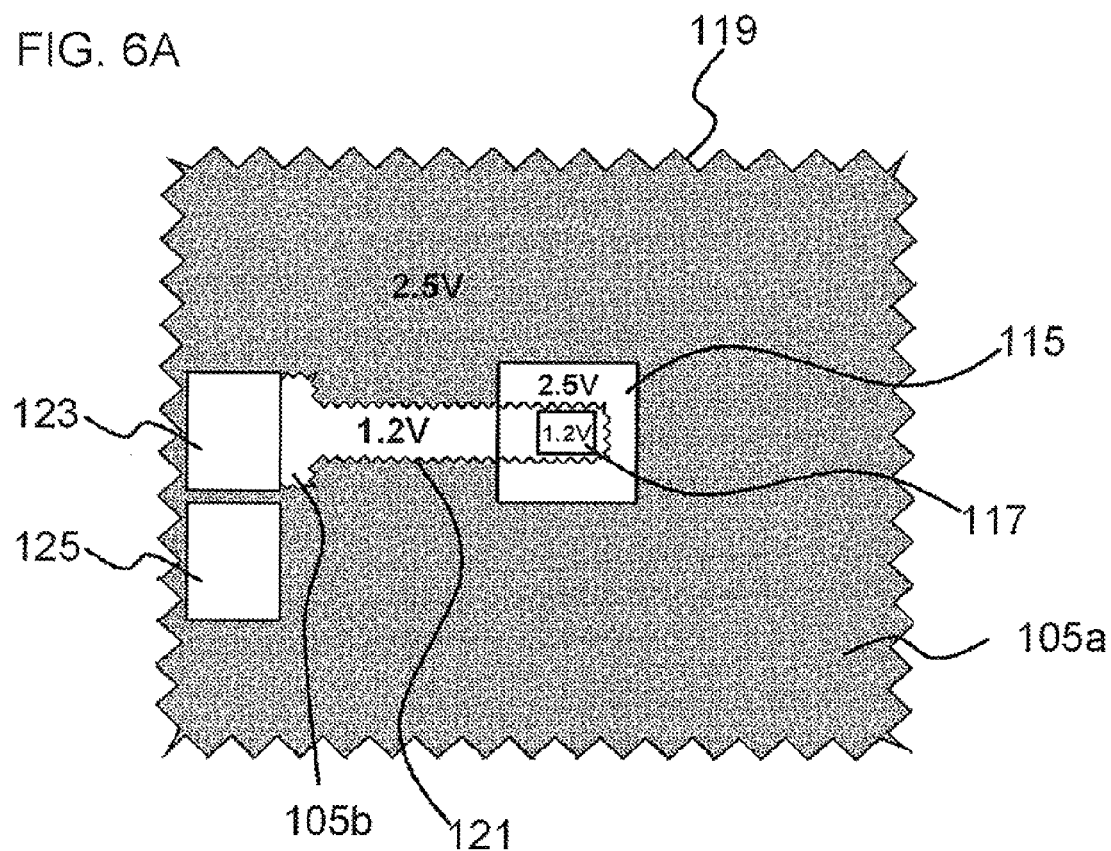
FIGS. 6A and 6B are plan views, illustrating configurations of semiconductor devices in an exemplary embodiment.
Figure 6B:
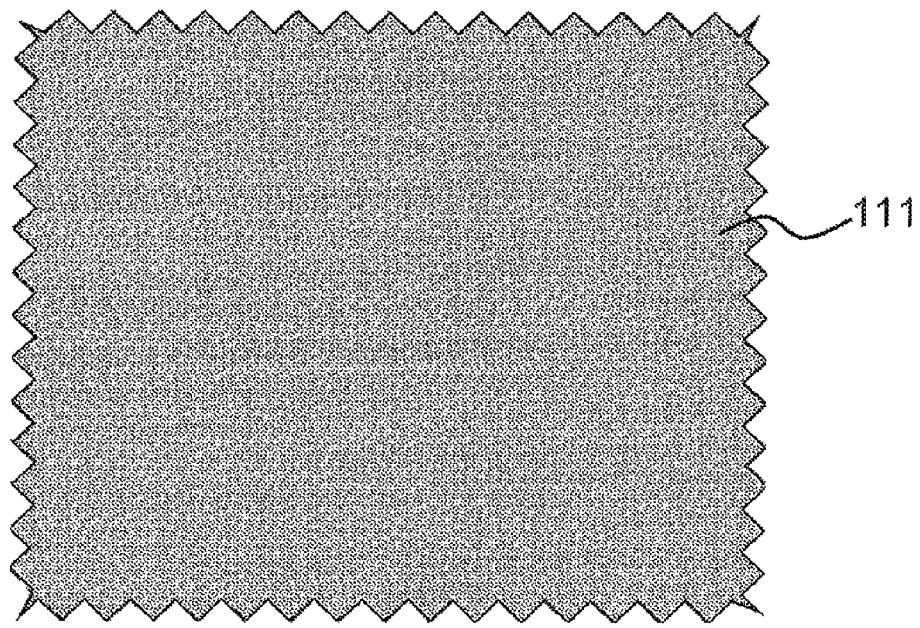

FIG. 6A is a plan view, illustrating a configuration of a semiconductor device in the present exemplary embodiment. In FIG. 6A, the source interconnects 105 of the printed circuit board, the semiconductor elements arranged on the printed circuit board, and DC to DC converters are illustrated. FIG. 6B is also a plan view, illustrating a configuration of the ground interconnect 111 of the semiconductor device shown in FIG. 6A.

While a basic configuration of the device shown in FIG. 6A and FIG. 6B is similar to that shown in FIG. 1 (first exemplary embodiment), a first semiconductor element 115 of a source voltage of 2.5 V and a second semiconductor element 117 of a source voltage of 1.2 V are provided on the printed circuit board in FIG. 6A, in place of the semiconductor element 103. In addition, the configuration shown in FIG. 6A is composed of a plurality of source interconnects (first source interconnect 105a and second source interconnect 105b). The first source interconnect 105a and the second source interconnect 105b are formed in a common source interconnect layer. The first source interconnect 105a serves as connecting the second semiconductor element 117 to a first DC to DC converter 125, and the second source interconnect 105b serves as connecting the first semiconductor element 115 to a second DC to DC converter 123.

Both of the first circumference portion 119 of the first source interconnect 105a and the second circumference portion 121 of the second source interconnect 105b are formed to have zigzag-shape. While the exemplary implementation, in which both of the width and the depth of the protruding portion provided in the circumference of the second source interconnect 105b are smaller than that of the protruding portion provided in the circumference of the first source interconnect 105a, is illustrated in the FIG. 6A, the width of and the depth of the protruding portion of the first circumference portion 119 and the second circumference portion 121 are defined by the frequency of noise to be eliminated, and are not particularly limited to that shown in the above exemplary implementation. Meanwhile, the geometry of the circumference of the ground interconnect 111 shown in FIG. 6B is the same as the geometry of the first circumference portion 119 of the first source interconnect 105a.

All of the tips of the protruding portions the first source interconnect 105a, the second source interconnect 105b and the ground interconnect 111 are connected to the decoupling capacitors, though it is not shown in FIG. 6A and FIG. 6B.

In the present exemplary embodiment, the protruding portions are also formed in the circumferences of the first source interconnect 105a and the ground interconnect 111, and the tips of the protruding portions are connected to the decoupling capacitors. Consequently, the same advantageous effect as in first exemplary embodiment can be obtained.

In addition, the dimension of the protruding portion (width and depth) is designed according to frequencies of the noises in the first source interconnect 105a and the second source interconnect 105b in the present exemplary embodiment. Consequently, the geometry of the protruding portion is preferably designed for the frequency of the noise created in each of the source interconnects. Thus, a reflection of the source noise and a formation of a resonance point generated in each of the source interconnects can be more effectively inhibited.

While the exemplary embodiments of the present invention have been illustrated in reference to the annexed figures, it is intended that the exemplary embodiments are presented for the purpose of illustrations only, and various modifications thereof may also be employed.

Specifically, a semiconductor device according to an exemplary aspect of the present invention includes the circuit board as described above; the decoupling capacitor connected to the protruding portion; and a semiconductor element mounted on a surface of the circuit board.

In addition to above, any arbitrary combination of each of these constitutions or conversions between the categories of the invention such as a process, a device, a method for utilizing the device and the like may also be within the scope of the present invention.

For example, a method according to an exemplary aspect of the present invention is a method for eliminating a noise from a circuit board having a two-dimensional geometry having a corner, wherein a source interconnect and a ground interconnect of the circuit board is provided to have a two-dimensional geometry, which contains a noise resonance point in a circumference thereof or in vicinity of the circumference in regions of the board except the corner, and wherein the noise is eliminated by guiding the noise generated in the source interconnect and the ground interconnect from the respective resonance points of the interconnect to a decoupling capacitor.

In addition, the same two-dimensional geometry or different two-dimensional geometries may be employed for the source interconnect 105 and the ground interconnect 111 in the above-described exemplary embodiments. If these two-dimensional geometries thereof are configured to be the same and the arrangement thereof are also configured to be the same in plan view, a generation of a capacitance between the electrodes can be inhibited, thereby further effectively preventing a generation of resonance points.

In addition, while the signal interconnect 127 and the signal interconnect 129 are illustratively provided in the front surface and the back surface of the printed circuit board 101, respectively, in the above-described exemplary embodiments as shown in FIG. 2, the arrangement in the signal interconnect layer is not limited thereto, and for example, a signal interconnect layer may alternatively be formed between the source interconnect 105 and the ground interconnect 111.

In addition, while the first decoupling capacitor 109 is illustratively provided in one surface of the printed circuit board 101 in the above-described exemplary embodiments, the arrangement of the first decoupling capacitor 109 is not limited thereto, and for example, the first decoupling capacitor 109 may alternatively be included in the printed circuit board 101.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

What is claimed is:

1. A circuit board including a source interconnect and a ground interconnect,
the circuit board having a two-dimensional geometry having a corner,
a plurality of protruding portions being provided in circumferences of said source interconnect and said ground interconnect in plan view,
the plurality of said protruding portions in said source interconnect being connected to a first terminal of a plurality of decoupling capacitors, each of said protruding portions in said source interconnect being connected to a different one of said decoupling capacitors, and
the plurality of said protruding portions in said ground interconnect being connected to a second terminal of said decoupling capacitors, each of said protruding portions being connected to a different one of said decoupling capacitors.

2. The circuit board as set forth in claim 1,
wherein the circuit board has a two-dimensional geometry having a side,
wherein plurality of said protruding portions are provided in circumferences of said source interconnect and said ground interconnect along said side in plan view.

3. The circuit board as set forth in claim 2, wherein said decoupling capacitors are disposed in outer most layers of respective regions for forming said protruding portion in plan view.

4. The circuit board as set forth in claim 1, wherein said protruding portion is provided over the entire circumference of said source interconnect and said ground interconnect.

5. The circuit board as set forth in claim 1, wherein a two-dimensional geometry of said protruding portion is symmetric to an axis extending from a tip of said protruding portion toward an interior of the interconnect.

6. The circuit board as set forth in claim 1, wherein the tip of said protruding portion is an edge like-shaped in plan view, and the top of the edge is connected to said decoupling capacitor.

7. The circuit board as set forth in claim 1, wherein circumferences of said source interconnect and said ground interconnect are formed to be zigzag-shape.

8. The circuit board as set forth in claim 1, wherein a circumference of said protruding portion is parabola-shape in plan view.

9. The circuit board as set forth in claim 1, wherein a two-dimensional geometry of said source interconnect is the same as a two-dimensional geometry of said ground interconnect.

10. A semiconductor device, comprising:
the circuit board as set forth in claim 1;
said decoupling capacitors connected to said protruding portion; and
a semiconductor element mounted on a surface of said circuit board.

11. The circuit board of claim 1, wherein said protruding portions each has a tip, and said decoupling capacitors is located in said tips of said respective protruding portions.

12. The circuit board of claim 1, wherein high frequency source noise from said source interconnect and high frequency ground noise from said ground interconnect converge to said protruding portions due to said protruding portions, while low frequency 5 source noise from said source interconnect and low frequency ground noise from said ground interconnected converge to said corner due to said protruding portions.

* * * * *